United States Patent
Mattson et al.

[11] Patent Number: 5,903,087
[45] Date of Patent: May 11, 1999

[54] ELECTRODE EDGE WAVE PATTERNS FOR PIEZOELECTRIC RESONATOR

[75] Inventors: John E. Mattson, Streamwood; James F. Caruba; Charles Zimnicki, both of Bartlett; Beverly A. Carroll, Marengo, all of Ill.

[73] Assignee: Motorola Inc., Schaumburg, Ill.

[21] Appl. No.: 08/920,442

[22] Filed: Aug. 29, 1997

Related U.S. Application Data

[63] Continuation-in-part of application No. 08/869,895, Jun. 5, 1997.

[51] Int. Cl.$^6$ .................................................. H01L 41/08
[52] U.S. Cl. ............................................. 310/365; 310/327
[58] Field of Search ................................ 310/320, 360, 310/361, 327, 363–366, 326

[56] References Cited

U.S. PATENT DOCUMENTS

| | | | |
|---|---|---|---|
| 4,211,947 | 7/1980 | Ikeno et al. | 310/365 X |
| 4,218,631 | 8/1980 | Yamaguchi | 310/312 |
| 4,370,584 | 1/1983 | Ikeno et al. | 310/365 |
| 4,468,582 | 8/1984 | Fujiwara et al. | 310/365 X |
| 4,564,782 | 1/1986 | Ogawa | 310/359 |
| 4,672,591 | 6/1987 | Breimesser et al. | 367/152 |
| 5,117,147 | 5/1992 | Yoshida | 310/320 |
| 5,414,321 | 5/1995 | Schropp et al. | 310/313 R |
| 5,578,974 | 11/1996 | Yang et al. | 333/187 |

FOREIGN PATENT DOCUMENTS

| | | | |
|---|---|---|---|
| 0138392 | 10/1979 | Japan | 310/365 |
| 59-174010 | 2/1984 | Japan | 310/365 |

*Primary Examiner*—Mark O. Budd
*Attorney, Agent, or Firm*—Brian M. Mancini; Gary J. Cunningham

[57] ABSTRACT

A resonator (104) including a piezoelectric plate (102) with an electrode (108) having a random pattern (100) along a portion of an edge of the electrode (108). The random pattern (100) dampens or destructively interferes with undesirable and inharmonic vibrational modes. For example, a rectangular AT-cut quartz resonator, which vibrates in a thickness-shear mode may also possess undesirable flexure and face-shear modes. These modes not only present undesirable spurious frequencies, they also change over temperature, disturbing a frequency-ternperature response of the resonator. The random pattern (100) causes diffuse and/or specular scattering to reduce these undesirable modes, providing a more uniform frequency-temperature response which is beneficial in temperature compensated crystal oscillator applications.

20 Claims, 4 Drawing Sheets

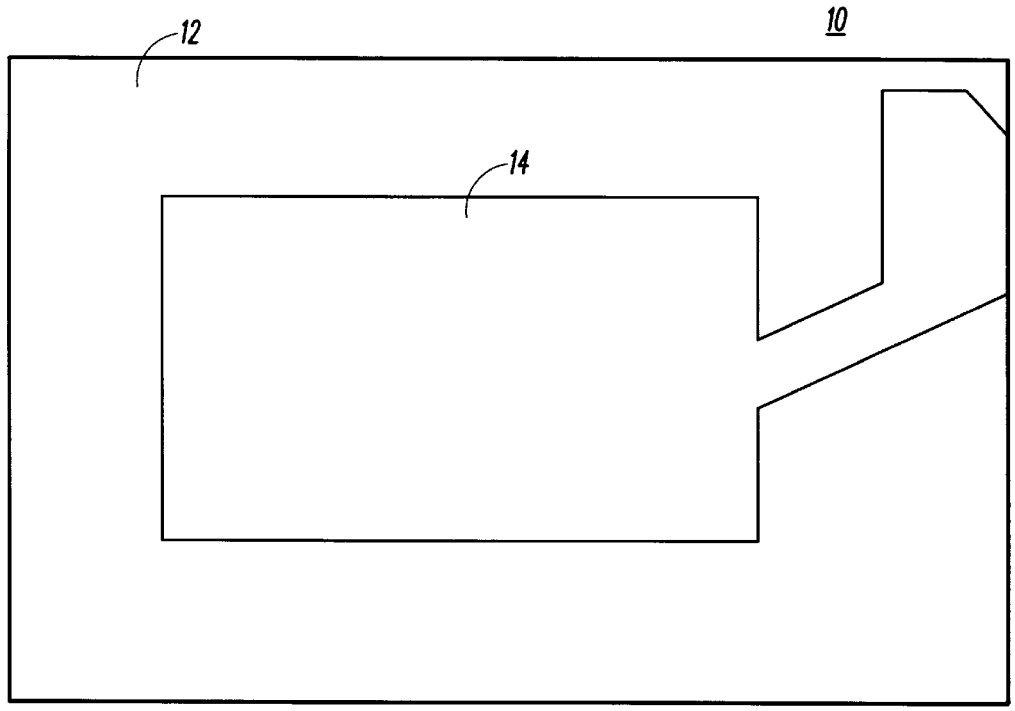
FIG.1 —PRIOR ART—
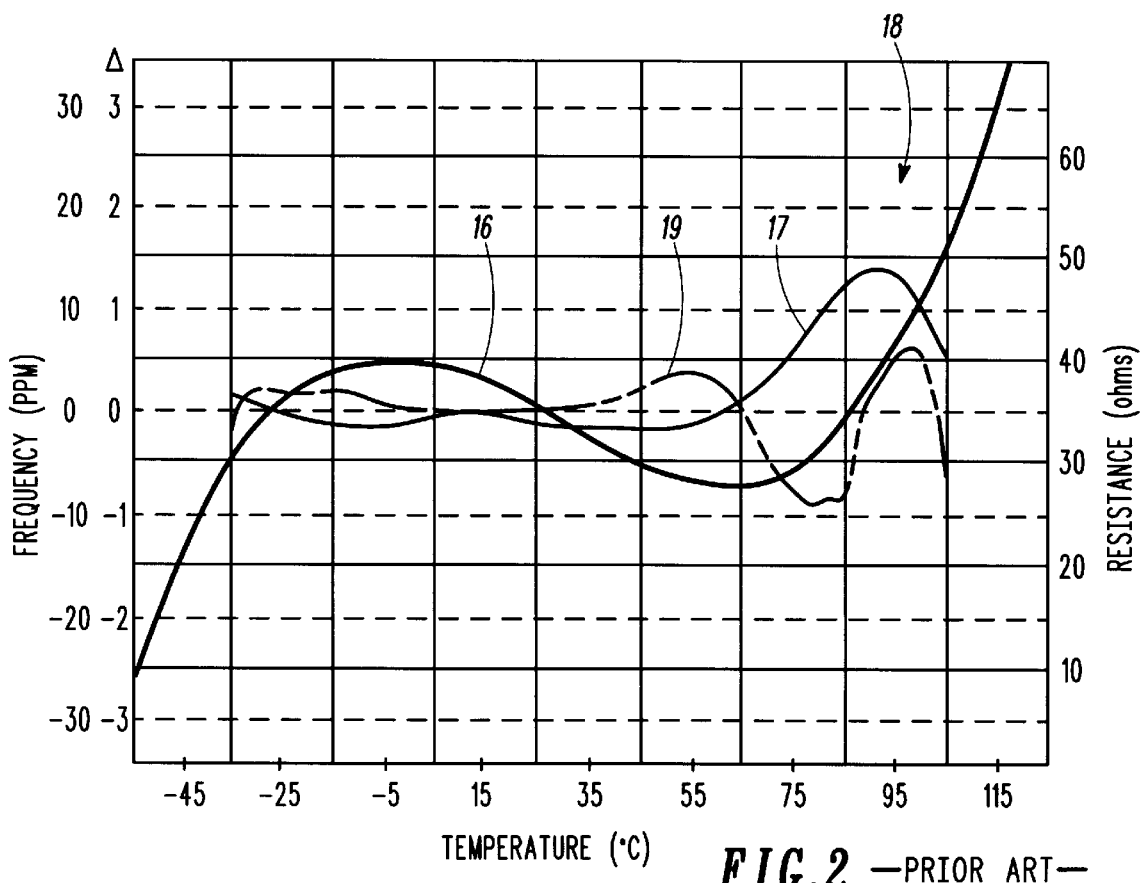
FIG.2 —PRIOR ART—

ELECTRODE EDGE WAVE PATTERNS FOR PIEZOELECTRIC RESONATOR

CROSS-REFERENCE TO RELATED APPLICATIONS

This is a continuation-in-part of application Ser. No. 08/869,895, filed Jun. 5, 1997.

FIELD OF THE INVENTION

The present invention relates generally to piezoelectric devices and, in particular, to electrode patterns on piezoelectric resonators for providing signals with improved temperature performance.

BACKGROUND OF THE INVENTION

Piezoelectric crystals have been used for many decades as frequency control elements in radio communication devices because of their stable resonant frequency signal generation during operation. The resonant frequency of a particular piezoelectric crystal is dependent on its vibrational mode of operation, its thickness, the density, and the elastic coefficients of material. Each of these parameters vary with changes in temperature. Therefore, the resonant frequency of the piezoelectric crystal changes with temperature.

There are no piezoelectric angle cuts that provide perfectly flat frequency-temperature curves (i.e. a curve demonstrating no frequency variation over a particular temperature range of interest). However, there are several known cuts of quartz that thermally compensate the crystal blank to have a relatively stable temperature performance. These include the AT, BT, GT and SC cuts, among others. Of these, the AT-cut is the predominantly used cut and ideally exhibits a frequency-temperature curve for a thickness-shear vibrational mode which should be recognized by those skilled in the art as the familiar Bechmann curve. The AT-cut also should ideally exhibit a substantially uniform resistance-temperature curve.

In the design of quartz crystal resonators, after properly designing the physical dimensions of the blank, the next most important issue is the proper design of the electrodes. The common approach to designing the electrodes for AT quartz crystals is to use the mass and dimensions of the electrodes to suppress undesired vibrational modes and inharmonics of the desired thickness-shear mode of the crystal.

The inharmonic modes are addressed by making the frequency of vibration of the desired mode low enough in the electroded region that it can not propagate outside of the electrodes, while at the same time assuring that the frequency of the inharmonic mode in the electroded region are high enough in frequency that they can propagate out of the electroded region. In this way the desired mode is said to be "trapped" under the electroded region. In this technique the inharmonic modes can propagate outside of the electrode to the mounts (or elsewhere on the blank) and be dampened. The coupling to these inharmonic modes is decreased within the electroded region precisely because the inharmonic modes are dampened at the edges.

In practice, the undesired vibrational modes that arise in piezoelectric crystals, such as AT-cut quartz for example, disturb the frequency-temperature and/or resistance-temperature performance of the crystal. These undesired vibrational modes cause disturbances, or "activity dips", in the frequency-temperature and/or resistance-temperature curves of the crystal. This results in a sudden and undesirable shift in frequency and/or resistance as the crystal changes temperature. This problem occurs in about 2–7% of AT-cut quartz crystals and causes serious difficulties for temperature compensation schemes and circuitry required to normalize the temperature variation of the quartz crystal, such as in a temperature compensated crystal oscillator (TCXO) application, for example.

An example of undesirable vibrational modes are face-shear and flexure modes that have frequencies near that of the desired thickness-shear vibrational mode. These undesirable modes exhibit their own frequency-temperature and/or resistance-temperature curves which are typically much steeper than the Bechmann curve. Where these curves intersect the Bechmann curve, vibrational coupling occurs which disturbs the Bechmann response. These disturbances, or activity dips, distort the frequency-temperature and/or resistance-temperature curves such that typical temperature compensation schemes can no longer compensate the higher-order perturbations caused by the activity dips.

There is a need for a piezoelectric resonator with a reduction of activity dips in a frequency-temperature and/or resistance-temperature curve, that can be realized in a simple, readily manufacturable form, at a low cost and high yield.

BRIEF DESCRIPTION OF THE DRAWINGS

FIG. 1 shows a top plan view of a prior art piezoelectric resonator;

FIG. 2 shows a graphical representation of an activity dip in a response of the piezoelectric resonator of FIG. 1;

DETAILED DESCRIPTION OF THE PREFERRED EMBODIMENT

Figure 3:
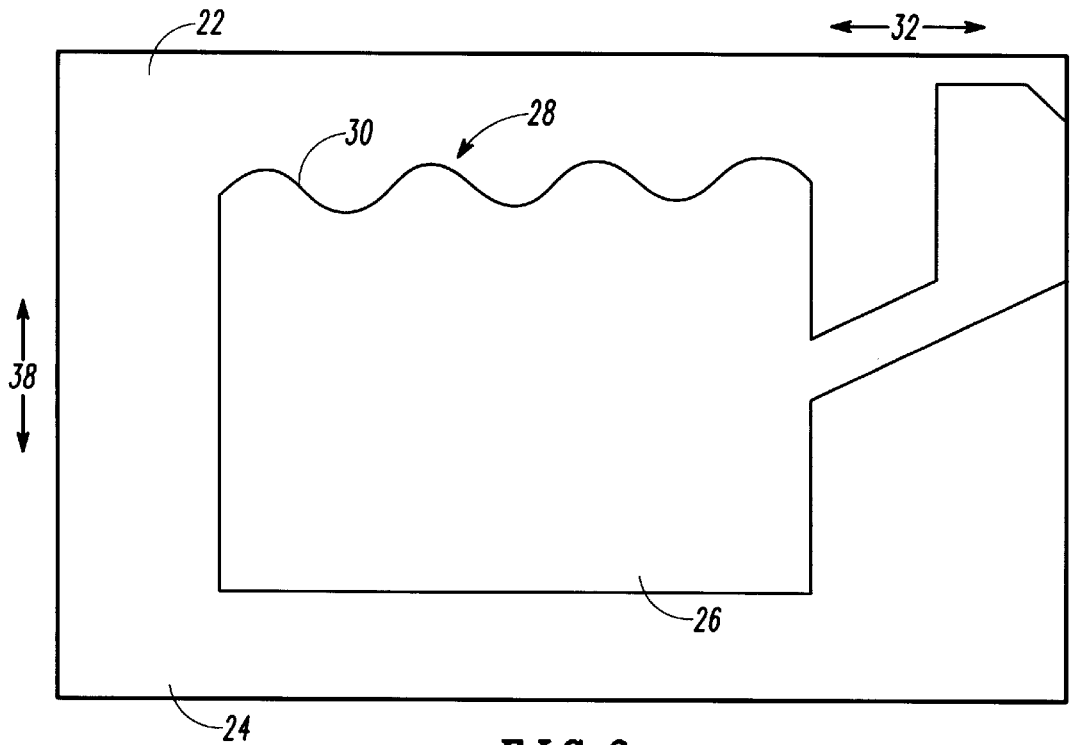
FIG. 3 shows a top plan view of a first embodiment of a piezoelectric resonator, in accordance with the present invention.

The present invention provides a specific electrode design, for a piezoelectric resonator, which dampens and/or destructively interferes with undesirable vibrational modes having frequencies that are close to a desired operating frequency. The electrodes, as disposed on a piezoelectric plate, have a random edge wave pattern which does not support undesired vibrational modes.

FIG. 1 shows a top view of a prior art piezoelectric resonator 10 which includes a piezoelectric substrate 12 with a disposed rectangular electrode 14. Typically, the resonator 10 is an AT-cut strip quartz blank with dimensions of about 188 mils (4.8 mm) in length by about 95 mils (2.4 mm) in width by about 5 mils (0.13 mm) thick, and the electrode 14 has dimensions of about 95 mils (2.4 mm) in length by about 65 mils (1.65 mm) in width. A bottom electrode (not shown) is of the same dimensions as the disposed electrode 14 and is overlapped by the disposed electrode 14.

For the AT-cut quartz example having a width in a crystallographic X-direction and a length in a crystallographic Z'-direction, the electrodes are used to drive a thickness-shear mode of vibration at a desired frequency. The frequency exhibits a substantially third-order frequency-temperature response commonly known as a Bechmann curve. For example, given a fundamental thickness-shear frequency of the resonator of about 13.0 MHz, undesirable vibration modes such as, but not limited to, face-shear modes and flexure modes also exist near 13.0 MHz. These are the modes that are of concern since only nearby frequency modes will adversely affect the thickness-shear mode over temperature.

The above undesirable modes couple to the desired thickness-shear mode over a predetermined range of temperatures causing a disturbance, or "activity dip", in the frequency-temperature response. It has been observed that these undesirable modes affect about 2–7% of a population of resonators, depending on the particular frequency model type being produced. This is a major problem in radio communication devices which require stable performance.

In general, resonators used in radio communication devices require some type of temperature compensation to maintain frequency stability to within ±5 ppm or less over a predetermined range of temperatures, typically −30° C. to 85° C. or more. In addition, the resonators are required to maintain a stable resistance due to the minimum current drain requirements of a radio or a limited amount of gain in the feedback loop of the radio. If the resistance of a resonator rises above a certain level, the radio may stop working.

To save size, cost and current, oscillator manufacturers use the simplest possible schemes to temperature compensate resonators. The majority of these schemes include either an analog type which provides a circuit with an inverse Bechmann (3rd order) function to compensate the Bechmann curve of the resonator, or a digital type which divides the Bechmann curve into temperature segments and normalizes each segment to a nominal frequency. The analog type suffers where high-order (over 3rd order) perturbations are present in the Bechmann curve. In these cases, the perturbation could not be compensated in any manner. The digital type suffers where large frequency variations exist within the chosen temperature segment. In this case, if the variation within the temperature segment is greater than the required limit (±5 ppm for example), then the oscillator will not meet the specification.

Although it is possible for one of the existing compensation schemes to sufficiently correct a frequency perturbation so as to meet a radio specification, neither of the analog or digital schemes address resistance perturbations. This is a major disadvantage since resistance activity dips can cause a radio to stop working completely, whereas frequency shifts may still allow the radio to operate, albeit in a diminished capacity.

FIG. 2 shows a graph of a frequency-temperature (Bechmann) curve 16, a resistance-temperature curve 17, and a delta deviation curve 19 of a prior art AT-cut quartz resonator that has been disturbed by an activity dip 18. The delta deviation curve 19 describes the deviation of the frequency-temperature curve from an ideal third-order Bechmann response. This parameter is important for those customer applications that have a temperature compensation algorithm limited to third-order terms.

As can be seen, the activity dip 18 causes a spike in the resistance-temperature curve 17 such that the resistance of the resonator increases from 33 ohms at 27° C. to a high of about 49 ohms at 89° C. There is nothing that a radio designer can do to compensate for this resistance. Therefore, if the resistance goes above a certain level, the resonator can no longer be used. In a resonator without activity dips the resistance can be expected to remain stable to within a few ohms across the entire temperature range.

Also, the activity dip 18 can disturb the frequency-temperature performance of the resonator from an ideal Bechmann response, as demonstrated by the delta deviation curve 19 which shows a deviation from the ideal Bechmann response by about ±0.9 ppm near 85° C. For a ±5 ppm radio application using a third-order temperature compensation algorithm which can not compensate for this delta deviation, it would be necessary to actually provide ±4.1 ppm of temperature compensation to meet the ±5 ppm specification. In reality, this situation is even worse where radio designers artificially tighten (wedge) their specifications to accommodate possible measurement errors. The presence of activity dips places serious constraints on a radio application and directly results in reduced yields. In a resonator without activity dips the delta deviation can be expected to remain below about ±0.2 ppm across the entire temperature range.

The desired mode of vibration in a piezoelectric blank, such as an AT-cut quartz crystal for example, is a thickness-shear vibration. This can be visualized as a wave extending in a thickness direction of the blank with the two major surfaces of the plate moving perpendicular to the thickness of the plate. One of the major surfaces moves in an opposite perpendicular direction from the other major surface of the plate. Of the undesired vibration modes, the face shear mode can be visualized as a wave in the width-length plane of the blank propagating along a length direction of the blank. The flexure mode can be visualized as a wave in the thickness-width plane of the blank propagating along a width direction of the blank. However, the flexure mode also has a vibrational component in the length direction of the blank. The present invention provides dampening of the face-shear and flexure modes.

FIG. 3 shows a first embodiment of the present invention including a piezoelectric resonator 20 having a piezoelectric plate 22 having an upper surface 24, a lower surface and outside edges. The plate 22 is the same as is used in the prior art resonator of FIG. 1. In the first embodiment, an upper electrode 26 is disposed on the upper surface 24 of the plate 22 and a lower electrode (not shown) is disposed on the lower surface of the plate. Preferably, the upper electrode 26 and lower electrode are situated centrally on the plate, opposite from each other and substantially aligned. However, these are not requirements of the invention. The electrodes could extend substantially to the plate edges, or could be located off center, either mutually or independently.

At least one of the upper and lower electrodes have a first pattern 28 along a portion of a first edge 30 of the at least one of the upper and lower electrode. Preferably, the first pattern 28 is periodic. When the electrode is biased or energized by an AC signal, the first pattern 28 causes destructive interference with an undesirable vibrational mode of the piezoelectric plate 22. The desired mode, such as a thickness-shear mode, is not affected because it is primarily trapped in the middle of the width of the plate. The undesirable vibrational mode includes, but is not limited to, at least one of the group consisting of flexure modes and face=shear modes. Destructive interference is provided by choosing the periodic pattern 28 to be of a different wavelength and/or amplitude than those of the flexure or face-shear modes.

Preferably, the upper and lower electrodes are substantially opposing and have substantially the same periodic pattern. The periodic pattern 28 is shown along a length direction 32 of the electrode 26. However, the periodic pattern 28 could also be located along a width direction 38 of the electrode 26, or on a portion of both the length and width of the electrode.

In still another embodiment, a separate electrode (either electrically connected or not connected) is provided with a periodic edge wave pattern. For example, a circular electrode which is completely or partially surrounded by a electrode ring which incorporates a periodic edge wave pattern in its design. In addition, using various electrode patterns such as concentric rings or lines located apart from the main electrode provide coherent specular scattering to suppress unwanted modes. Further, a series of additional electrodes can be patterned to provide further selective dampening (via destructive interference) for selected modes using a grating-like structure. Or provide a broad based destructive interference using an aperiodic grating. As before, these additional electrode can include a periodic edge wave pattern to further enhance the dampening character of the design.

It should be noted that the principle of using electrode edge wave patterns in the present invention can be extended to shapes which deviate slightly from rectangular or are substantially non-rectangular (e.g. round, oval, square, polygonal, hybrid or irregular shapes) plates and electrodes, also. In addition, the periodic pattern could appear on an edge of a void within the edge boundaries of the electrode plating. However, having an opening in the electrode plating could degrade the desired operating mode.

In a preferred embodiment the piezoelectric plate is a quartz crystal plate and, in particular, an AT-cut quartz plate. An AT-cut resonator, when energized by an AC signal, drives a desired thickness-shear mode of vibration within the quartz plate.

The periodic pattern can take on any waveshape such as square, triangular, sawtooth, alternating semi-circles, sinusoidal, etc. Also, the pattern could include a combination of different wavelengths, amplitudes, or waveshapes, and can includes gaps with no pattern. Preferably, the first periodic pattern is of a sinusoidal waveshape since this does not generate energy-wasting harmonics and most closely matches the naturally sinusoidal vibration modes. It is also envisioned that an ascending or descending wavelength within the wave pattern can be used to cover a specific range of wavelengths and frequencies. It is also possible to superimpose several waveforms of differing wavelengths along a portion of an edge of an electrode in order to generate a particular desired set of responses.

One of the novel aspects of the present invention is that it uses a wave pattern having a wavelength that is different than the wavelengths of those undesired vibrational modes having a frequency nearby that of a desired vibrational mode. Using a wave pattern with a wavelength the same as one of the undesired vibrational modes may constructively support that mode which is not desired. The present invention advantageously uses a wave pattern having a wavelength that is different than the wavelengths of nearby undesired vibrational mode thereby destructively interfering with those modes (e.g. face-shear or flexure modes, for example) reducing their impact on the desired mode (e.g. a thickness shear-mode in an AT-cut quartz resonator, for example).

Preferably, the first periodic pattern has a first wavelength that is between the wavelengths of the group of undesirable vibrational modes, such as face-shear or flexure modes, for example. The wavelength of the first periodic pattern can be the average of all the wavelengths of the nearby undesired vibrational modes, or it can be a weighted average of all the nearby undesired vibrational modes, or most practically it can be a weighted average of the most dominant nearby undesired vibrational modes, particularly those modes which disturb the frequency-temperature or resistance-temperature response of the resonator.

Although, the wavelength of the first periodic pattern can match, and may therefore support, a wavelength of other vibrational modes, the frequency of those vibrational modes will not be close to the frequency of the desired vibrational mode (e.g. thickness-shear) so as to couple to and adversely disturb the desired frequency-temperature or resistance-temperature response.

Figure 4:
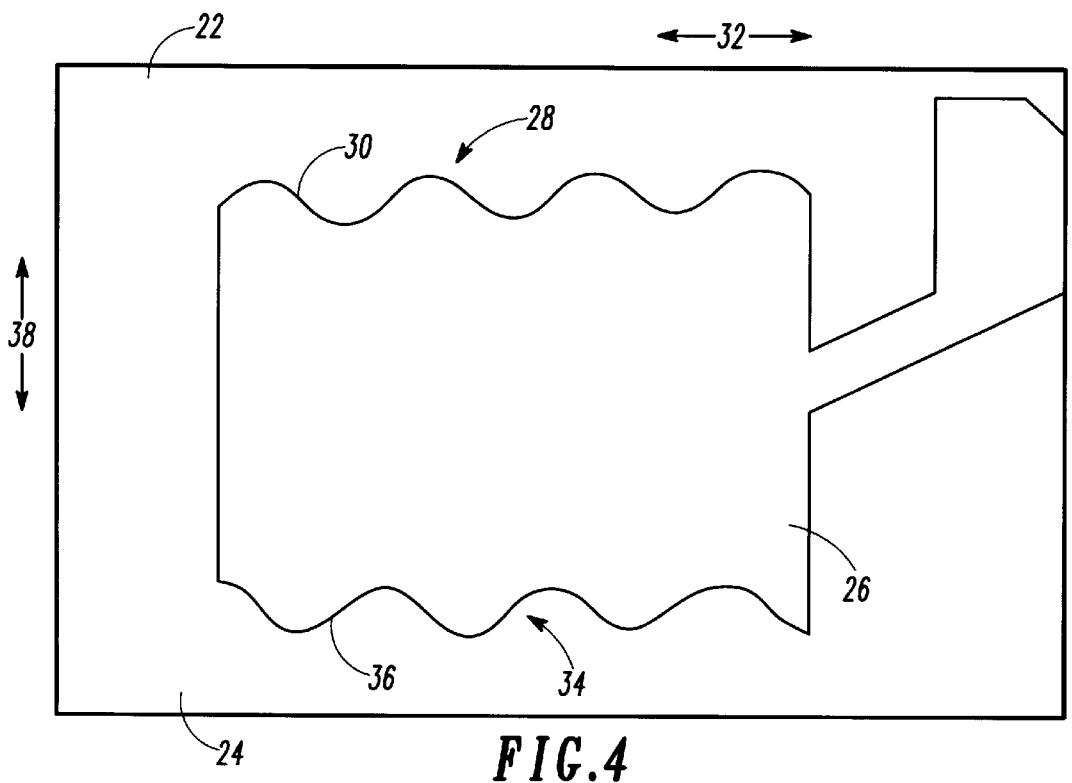
FIG. 4 shows a top plan view of a second embodiment of a piezoelectric resonator, in accordance with the present invention.

FIG. 4 shows a second and preferred embodiment of the present invention which includes at least one electrode being generally rectangular with a first periodic pattern 28 substantially along a first edge 30 in a length direction 32 of the plate 22 and a second periodic pattern 34 substantially along an opposite second edge 36 in a length direction 32 of the plate 22. Preferably, the first periodic pattern 28 is offset about one-quarter wavelength from the second periodic pattern 34 along the length direction 32 of the plate 22. A quarter wavelength offset serves to discourage any off-frequency undesired modes (e.g. face-shear and flexure) that have a wavelength near that of the first periodic pattern. Such modes contribute to spurious frequency modes which could adversely affect potential customer applications, even though these modes are away from a desired mode and frequency (e.g. thickness-shear) and would not affect the Bechmann curve.

Alternatively, the first and second periodic patterns could have different wavelengths to address different undesired vibrational modes. Moreover, the first and second periodic patterns could have different amplitudes as needed to diminish an undesirable mode.

In a more preferred embodiment, the upper and lower electrodes have corresponding and aligned first and second periodic patterns, respectively. More particularly, the electrode patterns are the same and are aligned.

Figure 5:
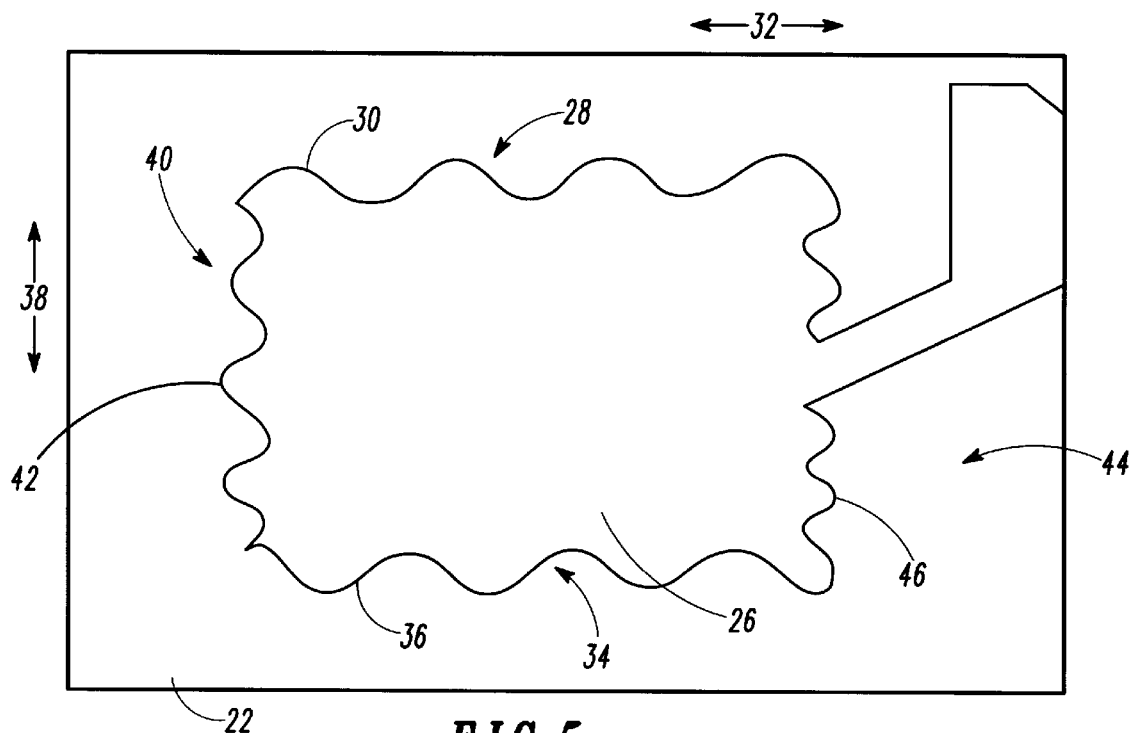
FIG. 5 shows a top plan view of a third embodiment of a piezoelectric resonator, in accordance with the present invention.

FIG. 5 shows a third embodiment of the present invention which incorporates all the limitations of FIG. 4, which is hereby incorporated by reference. In this third embodiment, the at least one electrode 26 includes a third periodic pattern 40 along a portion of a third edge 42 in a width direction 38 of the plate 22, and a fourth periodic pattern 44 along a portion of an opposite fourth edge 46 in the width 38 direction of the plate 22. This is useful in cases were a specific undesired vibrational mode has a predominant effect in a width direction 38 of the plate 22. These cases can be addressed by the third and fourth periodic patterns 40, 44 independently of an undesired vibrational mode having a predominant affect in a length direction 32 of the plate 22 which are addressed by the first and second periodic patterns 28, 34.

In particular, this embodiment includes the first and second periodic patterns have a first periodicity, and the third and fourth periodic patterns have a second periodicity such that, when the electrodes are energized by an AC signal, the first and second periodic patterns cause destructive interference with a first undesirable vibrational mode and the third and fourth periodic patterns cause destructive interference with a second undesirable vibrational mode. Moreover, at least one of the first and second periodic patterns or the third and fourth periodic patterns could be offset by one-quarter wavelength for the reasons stated earlier.

For example, in a rectangular AT-cut quartz resonator having a width in the X-direction and a length in a Z-direction, or a width in the Z-direction and a length in a X-direction, the first and/or second periodicity is chosen to be at a wavelength away from a periodicity of an undesired face-shear vibrational mode which is nearby a desired thickness-shear vibrational mode. Whereas, the second periodicity is chosen to be at a wavelength away from a periodicity of an undesired flexure vibrational mode which is nearby a desired thickness-shear vibration mode, also.

In an alternative embodiment, the periodic patterns could have any combination of different periodicities to address undesired vibrational modes in either of a corresponding length or width direction of the plate. This can include differences in wavelengths between corresponding edges of the upper and lower electrodes. Moreover, the periodic patterns can take on any waveshape such as square, triangular, sawtooth, alternating semi-circles, sinusoidal, etc. Preferably, the periodic patterns are of a sinusoidal shape since this does not generate energy-wasting harmonics and most closely matches the naturally sinusoidal vibration modes. The patterns could also have ascending or descending wavelengths within the wave pattern which can be used to cover a specific range of wavelengths and frequencies. It is also possible to superimpose several waveforms of differing wavelengths along a portion of any of the periodic patterns in order to generate a particular desired set of responses.

In addition, the periodic patterns could have any combination of different amplitudes to address undesired vibrational modes of differing magnitudes. This can include differences in amplitude of wave patterns between corresponding edges of the upper and lower electrodes. The patterns could also have ascending or descending amplitudes within the wave pattern to cover a specific range of magnitudes.

Alternatively, the present invention also contemplates the use of a random edge pattern for the electrode edge and/or the piezoelectric plate edge. The random edge pattern can be characterized by a particular "roughness", where the term "roughness" is defined as is commonly known in the art. The random edge pattern can also consist of randomly (or pseudorandomly) placed holes, randomly sized holes, or a combination of the two.

Figure 7:
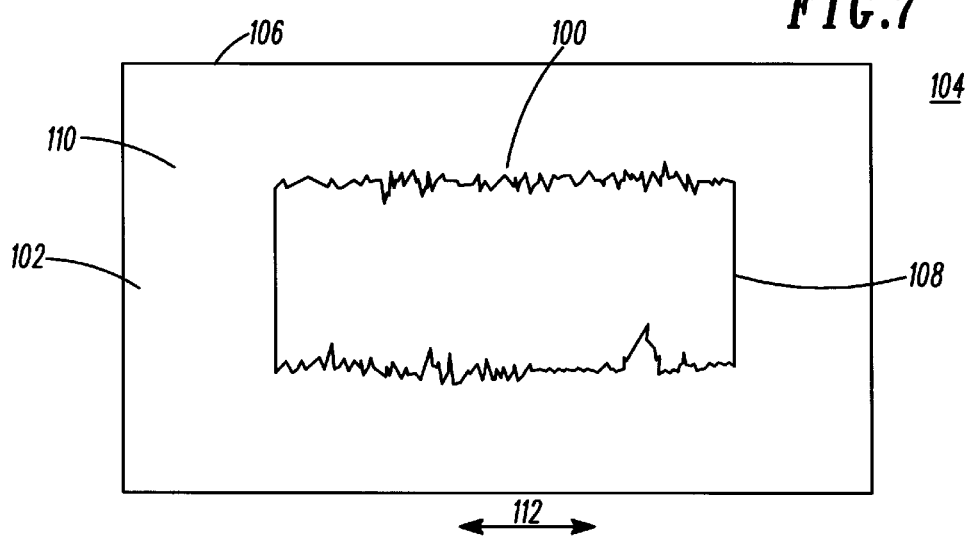
FIG. 7 shows a top plan view of a alternate embodiment of a piezoelectric resonator, in accordance with the present invention.

FIG. 7 shows a one embodiment of the present invention with a random edge pattern 100 for the edge of the electrode 108 edge or plate edge 106. A piezoelectric resonator 104 is shown having a piezoelectric plate 102 having an upper surface 110, a lower surface and an outside edge 106. The plate 102 is the same as is used in the prior art resonator of FIG. 1. An upper electrode 108 is disposed on the upper surface 110 of the plate 102 and a lower electrode (not shown) is disposed on the lower surface of the plate. Preferably, the upper electrode 108 and lower electrode are situated centrally on the plate, opposite from each other and substantially aligned. However, these are not requirements of the invention. The electrodes could extend substantially to the plate edges, or could be located off center, either mutually or independently.

At least one of the upper and lower electrodes have a random pattern 100 along a portion of a first edge of the at least one of the upper and lower electrode. When the electrode is biased or energized by an AC signal, the first pattern 100 dampens or causes destructive interference with an undesirable vibrational mode of the piezoelectric plate 102.

Preferably, the upper and lower electrodes are substantially opposing and have substantially the same pattern 100. The random pattern 100 is shown along both length direction 112 of the electrode 108. However, the random pattern 100 could also be located along a portion of either or both width directions of the electrode 108, or on a portion of both the length and width of the electrode. It should be noted that the principle of using electrode edge patterns in the present invention can be extended to electrode shapes which deviate slightly from the general rectangular shape or are substantially non-rectangular (e.g. round, oval, square, polygonal, hybrid or irregular shapes) plates and electrodes, also. In addition, the random pattern could appear on an edge of a void within the edge boundaries of the electrode plating. However, having an opening in the electrode plating could degrade the desired operating mode.

In a preferred embodiment the piezoelectric plate is a quartz crystal plate and, in particular, an AT-cut quartz plate. An AT-cut resonator, when energized by an AC signal, drives a desired thickness-shear mode of vibration within the quartz plate.

One of the novel aspects of the present invention is that it uses a random edge pattern of a designed roughness to dampen or destructively interfere with undesired vibrational modes (e.g. face-shear or flexure modes, for example) reducing their impact on the desired mode (e.g. a thickness shear-mode in an AT-cut quartz resonator, for example).

The present invention decreases the effect of the inharmonics of a desired mode and undesired spurious modes by using a combination of specular and diffuse scattering of the acoustic waves to selectively dampen the undesired modes. The previous discussion of using periodic edge wave patterns addresses the issue of using specular scattering (destructive interference of the unwanted modes) to dampen (via destructive interference) the undesired mode of vibration.

An acoustic resonator can be thought of as a device where a sound wave is generated and which propagates from the source outward. In the case of an "infinite-plate" thickness shear device, similar to the AT quartz crystals used here, this sound wave propagates from the top electrode down to the bottom electrode and is reflected (scattered) from the bottom surface back up to the top. If the frequency of the driving force is such that the returning acoustic wave is in phase with the generated wave then constructive inference occurs and a resonance condition is established. This type of scattering can be referred to as specular scattering where the entire wave is reflected completely back to the source. In a real resonator this sound wave also propagates in the lateral directions as well and also the wave is not entirely reflected back in the same direction (portions of the wave may be reflected in different directions).

Using this analogy of scattering of traveling waves, one can begin to look at the effects of roughness (or diffuse scattering) on the performance of a crystal. In this alternate embodiment of the present invention, diffuse scattering is used to reduce the amplitude of the undesired modes of vibration.

Essentially all scattering problems can be thought of using the optical analogy where light traveling from one medium to another is partially reflected and partially transmitted. The magnitude of the reflected and transmitted light depends on the differences in the index of refraction of the different media. In the case of acoustics a very similar thing occurs, only instead of the index of refraction, the quantity of interest is the speed of sound in the different media. Therefore, in an acoustic device, a boundary can be defined as the physical dimensions of the blank (the interface between air and quartz for example) or can be the boundary between areas with different thickness or densities (for example a boundary created by the difference between the sound velocity under electrodes versus an area without electrodes).

Figure 8:
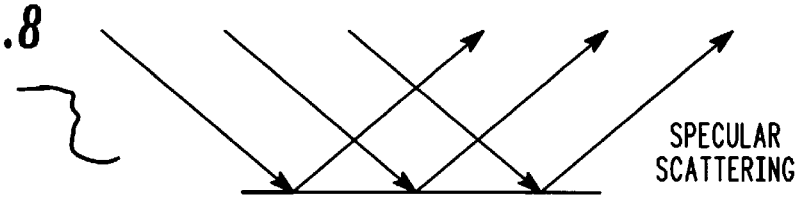
FIG. 8 shows a graphical representation of an example of specular scattering of a wave.
Figure 9:
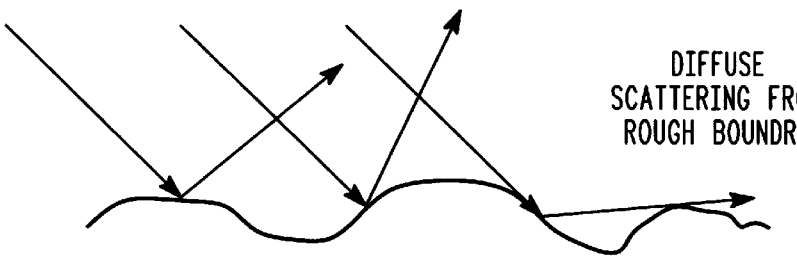
FIG. 9 shows a graphical representation of an example of diffuse scattering of a wave.

There are two basic forms of scattering in operation here: specular and diffuse scattering. The basic definition of specular scattering is the scattering of a wave from one direction from a boundary as shown in FIG. 8. Diffuse scattering, on the other hand, is the scattering of a wave from a point in all directions. In the context used here, if the boundary producing the scattering is smooth and regular then specular scattering will dominate, whereas when the boundary is rough diffuse scattering will dominate. A rough boundary is loosely defined as a boundary with fluctuations in the position of the boundary which are comparable to the wavelength of the scattered wave, see FIG. 9. One consequence of this is that a boundary which appears to be rough for short wavelengths will appear smooth at longer wavelengths. It should be noted that the roughness can be of a larger or smaller dimension than the wave to be scattered. Preferably, the roughness is greater than about $\lambda/10$ of the wave to be scattered and less than about $2\lambda$ of the wave to be scattered.

Another consequence of a rough boundary is that the forward scattering (or transmission) decreases as the wavelength decreases (assuming the lateral coherence length of the waves remain constant and that the speed of sound is independent of frequency). In other words, as the wavelength decreases the boundary appears rougher and rougher. Whereas, for the ideal smooth boundary, the scattering is unaffected by a change in wavelength. (Examples of this phenomena abound in the fields of Acoustic imaging, x-ray diffraction, electron diffraction, optical imaging and diffraction, for example) Thus, in effect, a diffuse boundary acts as a low-pass filter, where the longer wavelengths see a smooth boundary represented by an "average" reflective boundary and the shorter wavelengths see a rough boundary.

The present invention puts this concept to use in the design of electrodes (and blanks as well) for resonators. In the "thin plate" resonator the fundamental thickness shear mode has a lateral (perpendicular the boundary normal of the plate) wavelength given by the dimensions of the electrode and are typically quite large relative to the wavelength in the thickness direction. In contrast, the flexural and face shear modes (in the frequency range near a thickness shear resonance) have lateral wavelengths which are very small compared to the lateral wavelength of the fundamental thickness shear mode. Therefore if a rough boundary could be created which leaves the fundamental mode nominally unaffected and dampens the spurious modes one could improve the overall performance of the crystal. Examples of this will be discussed in the next section.

One further note of consequence is that contrary to prior art designs, which are quite sensitive to variations in the physical parameters of the design, designs based on rough boundaries are inherently less sensitive to fluctuations in the boundary.

The concept of using rough boundaries to enhance process stability can be used in both the design of the blank dimensions and the electrode dimensions. In the case of blank dimensions the boundary to be roughened is the blank-air interface. In the case of electrodes, the boundary to be roughened is between the regions with and without electrodes, where the region with the electrodes will have lower frequencies due to the mass-loading of the electrode, and the regions without the electrodes are stiffened by the open-circuit condition of the boundary.

In one embodiment, the lateral edges of the crystal blank are designed with a predetermined roughness. This will dampen any modes which travel to the edges of the blank, and in particular will dampen the high frequency flexural and other modes with high spatial frequency (short wavelength). For a 14 MHz AT-cut blank (about 0.005" thick), which is 0.250" in diameter, the amplitude of the roughness on the edges should be on the order of about ±0.0001" to about ±0.002".

In another embodiment, rough edges can be incorporated into the electrode pattern on the blank. Again for a 14 Mhz blank of 0.250" diameter, the amplitude of the roughness on the edges should be on the order of a ±0.0001" to ±0.002".

Figure 10:
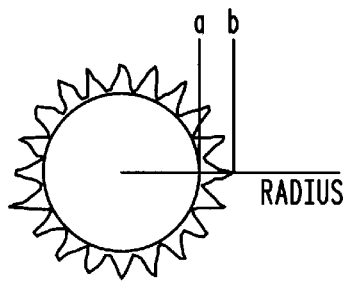
FIG. 10 shows a simplified top plan view of an electrode of a piezoelectric resonator having a random edge pattern, in accordance with the present invention.
Figure 11:
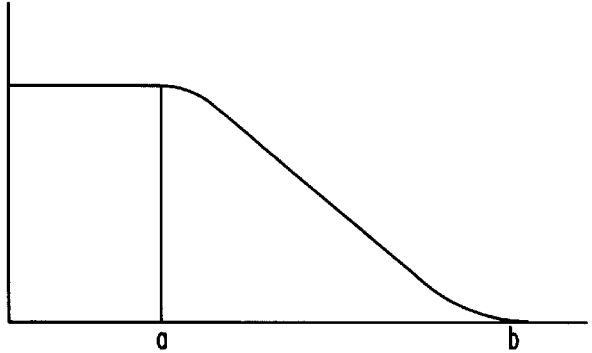
FIG. 11 shows a graphical representation of an average electrode thickness at boundaries of the edge pattern of the electrode of FIG. 10.

In another embodiment, electrode edge roughness is used as a means of providing limited contouring of the crystal. As discussed above if the fluctuations in thickness of the electrode are more rapid than the spatial frequency of the desired mode, then that mode will see the electrode as an average of the overall electrode. For example, FIG. 10 shows a generally round electrode with a random fluctuating edge pattern contained with boundaries a and b along a radius of the electrode. In this case, the fundamental mode would see an electrode with an average thickness profile as shown in FIG. 11. Further, since the metallization used for electrodes is much denser than quartz (19 g/cc for Au compared to 2.7 g/cc for quartz) an effective thickness contour can be added to the blank. For example, a 6000 Angstrom Au film would be equivalent to about 0.00015" of quartz. Therefore, with the proper choice of electrode profile one can add an appreciable effective contour to the crystal.

These embodiments can be combined to improve process stability and reduce the effect of process variation on the performance of the product. In addition, the random edge pattern can be superimposed upon the periodic wave patterns of FIGS. 3–5, resulting in a combination of specular and diffuse scattering to further optimize device performance.

In still another embodiment, a separate electrode (either electrically connected or not connected) is provided with rough boundaries. For example a circular electrode which is completely or partially surrounded by a electrode ring which incorporates roughness in its design. In addition, using various electrode patterns such as concentric rings or lines located apart from the main electrode provide coherent specular scattering to suppress unwanted modes. Further, a series of additional electrodes can be patterned to provide further selective dampening (via destructive interference) for selected modes using a grating-like structure. Or provide a broad based dampening or destructive interference using an aperiodic grating. As before, these additional electrode can include roughness to further enhance the dampening character of the design.

Finally, it should also be mentioned that structures formed as discussed above can be made using non-metallic materials as well, as there is a conducting electrode somewhere on, or near, the blank The present invention differs from the prior art in that roughness is designed into the boundaries of the blank and/or electrode to provide diffuse scattering from those boundaries. Advantageously, the present invention can be used to complement and augment prior art devices to reduce undesired vibrational modes. In addition, by designing roughness into the electrode and/or blank it is possible to decrease the sensitivity of the product to fluctuations of the blank or electrode dimensions arising from processing. Thus, in effect, the present invention increases process stability, and therefore yield.

Figure 6:
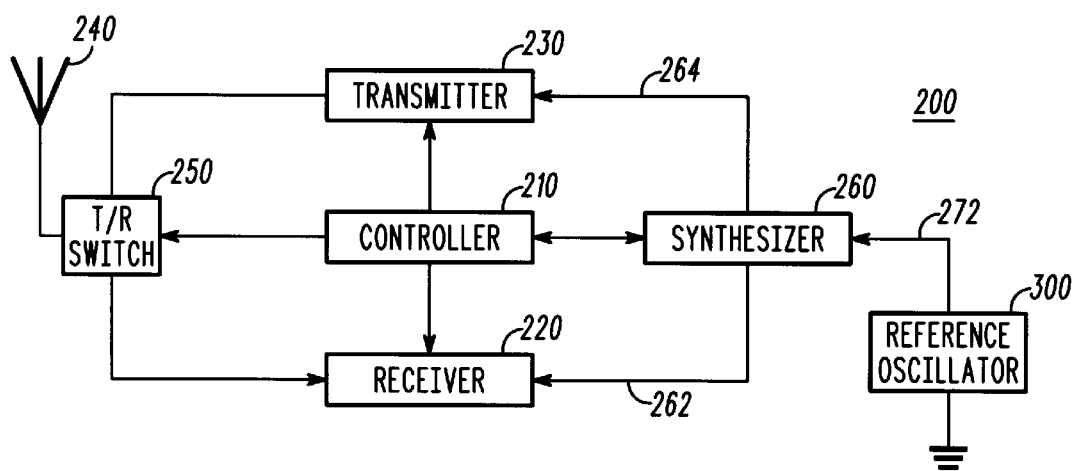
FIG. 6 shows a communication device incorporating a piezoelectric resonator, in accordance with the present invention.

FIG. 6 shows a block diagram of a communication device 200 which includes a temperature compensated crystal oscillator (TCXO) circuit as a reference oscillator 300. The TCXO circuit utilizes a quartz resonator, in accordance with the present invention. In one embodiment, the communication device 200 is a well known frequency synthesized two-way transceiver which operates under the control of a controller 210. The communication device 200 includes a receiver 220 and a transmitter 230 which receive and transmit RF via an antenna 240. The antenna 240 is appropriately coupled between the receiver 220 and the transmitter 230 by a duplexer or an antenna switch 250. The communication device 200 also includes a well known phase locked loop synthesizer 260 which, under the control of the controller 210, provides a receiver local oscillator signal 262 and a transmitter local oscillator signal 264. The reference oscillator 300 includes the quartz resonator of the present invention and provides a reference signal 272 for the synthesizer 260. The reference signal 272 is generated utilizing the principles of the present invention.

Although various embodiments of this invention have been shown and described, it should be understood that various modifications and substitutions, as well as rearrangements and combinations of the preceding embodiments, can be made by those skilled in the art, without departing from novel spirit and scope of this invention.

What is claimed is:

1. A piezoelectric resonator, comprising:
   a piezoelectric plate having an upper and a lower surface and outside edges;
   an upper electrode disposed on the upper surface of the plate;
   a lower electrode disposed on the lower surf ace of the plate; and
   at least one of the upper and lower electrodes having a random pattern along a portion of a first edge of the at least ones electrode such that the pattern of the electrodes when energized by an AC signal causes destructive interference with an undesirable vibrational mode of the piezoelectric plate.

2. The resonator of claim 1, wherein the piezoelectric plate is a quartz crystal plate.

3. The resonator of claim 2, wherein the quartz plate is an AT-cut and the electrodes, when energized by an AC signal, produce a desired predominantly thickness-shear mode of vibration within the quartz plate.

4. The resonator of claim 1, wherein the upper and lower electrodes are substantially opposing and have substantially the same pattern and are aligned.

5. The resonator of claim 1, wherein the undesirable vibrational mode is at least one of the group consisting of a flexure mode and a face-shear mode.

6. The resonator of claim 1, wherein the pattern comprises random fluctuations which dampens the undesirable vibrational mode of the piezoelectric plate, the dampening consisting of at least one of the group consisting of specular scattering and diffuse scattering.

7. The resonator of claim 6, wherein the fluctuations in the pattern have a roughness which is about equal in dimension to a wavelength of the undesirable vibrational mode, wherein diffuse scattering of the undesirable vibrational mode occurs.

8. The resonator of claim 7, wherein an amplitude of the roughness is less than about 2 mils.

9. The resonator of claim 7, wherein an amplitude of the roughness is chosen to effectively contour a mass loading function of the resonator.

10. The resonator of claim 1, wherein the outside edges of the plate are at least partially provided with a roughness which is about equal in dimension to a wavelength of the undesirable vibrational mode, wherein diffuse scattering of the undesirable vibrational mode occurs.

11. The resonator of claim 10, wherein an amplitude of the roughness of the outside edges is less than about 2 mils.

12. A piezoelectric resonator, comprising:
    a piezoelectric plate having an upper and a lower surface and outside edges;
    an upper electrode disposed on the upper surface of the plate;
    a lower electrode disposed on the lower surface of the plate; and
    an electrode ring which at least partially surrounds at least one of the electrodes, the electrode ring having a pattern along a portion of an edge of the electrode ring such that the pattern of the electrode ring causes dampening of an undesirable vibrational mode of the piezoelectric plate.

13. The resonator of claim 12, wherein the pattern is provided with a roughness which is about equal in dimension than a wavelength of the undesirable vibrational mode, wherein diffuse scattering of the undesirable vibrational mode occurs.

14. The resonator of claim 12, wherein the electrode ring is non-metallic.

15. A piezoelectric resonator, comprising:
    a piezoelectric plate having an upper and a lower surface;
    an upper electrode disposed on the upper surface of the plate;
    a lower electrode disposed on the lower surface of the plate; and
    at least one of the upper and lower electrodes having a pattern of random fluctuations superimposed upon a periodic pattern along a portion of a first edge of the at least one electrode, the pattern of the electrode, when energized by an AC signal, causing dampening and destructive interference with an undesirable vibrational mode and inharmonic modes of the piezoelectric plate, the dampening and destructive interference consisting of diffuse scattering and specular scattering.

16. An AT-cut quartz resonator, comprising:
    a piezoelectric plate having an upper and a lower surface and outside edges, the plate, when energized with an AC signal between the upper and lower surfaces, producing a desired predominantly thickness-shear mode of vibration, and an undesired face-shear and flexure mode of vibration;
    an upper electrode having an edge disposed on the upper surface of the plate;

a lower electrode having an edge disposed on the lower surface of the plate; and the upper and lower electrodes having a similar random pattern comprising random fluctuations along a portion of the edges of the electrodes such that the random patterns of the electrode, when energized by the AC signal, dampen the undesired face-shear and flexure vibrational modes which cause activity dips in the frequency-temperature response of the resonator, the dampening consisting of at least one of the group consisting of specular scattering and diffuse scattering.

17. The resonator of claim 16, wherein the fluctuations in the pattern have a roughness which is about equal in dimension than a wavelength of the undesirable vibrational mode, wherein diffuse scattering of the undesirable vibrational mode occurs.

18. The resonator of claim 17, wherein an amplitude of the roughness is chosen to effectively contour a mass loading function of the resonator.

19. The resonator of claim 16, wherein the outside edges of the plate are at least partially provided with a roughness which is about equal in dimension than a wavelength of the undesirable vibrational mode, wherein diffuse scattering of the undesirable vibrational mode occurs.

20. A communication device having at least a receiver, the receiver comprising:

a frequency synthesizer for generating local oscillator signals including a reference crystal oscillator comprising:

a piezoelectric plate having an upper and a lower surface;

an upper electrode disposed on the upper surface of the plate;

a lower electrode disposed on the lower surface of the plate; and at least one of the upper and lower electrodes having a random pattern along a portion of a first edge of the at least one electrode such that the pattern of the electrode, when energized by an AC signal, causes destructive interference with an undesirable vibrational mode of the piezoelectric plate.

* * * * *